US012805123B2

(12) United States Patent
Miao et al.

(10) Patent No.: US 12,805,123 B2
(45) Date of Patent: Nov. 17, 2026

(54) FLEXIBLE DISPLAY PANEL, METHOD FOR PREPARING THE SAME, AND STRETCHABLE DISPLAY DEVICE

(71) Applicant: KUNSHAN GO-VISIONOX OPTO-ELECTRONICS CO., LTD., Kunshan (CN)

(72) Inventors: Zhancheng Miao, Kunshan (CN); Qing Bai, Kunshan (CN); Zhilin Guo, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 365 days.

(21) Appl. No.: 18/442,434

(22) Filed: Feb. 15, 2024

(65) Prior Publication Data

US 2024/0188338 A1 Jun. 6, 2024

Related U.S. Application Data

(63) Continuation of application No. PCT/CN2022/122160, filed on Sep. 28, 2022.

(30) Foreign Application Priority Data

Jun. 30, 2022 (CN) ......................... 202210760947.7

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/80515* (2023.02); *H10K 2102/311* (2023.02)

(58) Field of Classification Search
CPC ............. H10K 59/122; H10K 59/1201; H10K 59/80515; H10K 2102/311; H10K 50/80;
(Continued)

(56) References Cited

U.S. PATENT DOCUMENTS

2019/0355800 A1 11/2019 Saitoh et al.
2021/0225984 A1* 7/2021 Wang .................. H10K 50/844
(Continued)

FOREIGN PATENT DOCUMENTS

CN 110544714 A 12/2019
CN 110767690 A 2/2020
(Continued)

OTHER PUBLICATIONS

Office Action issued on Aug. 9, 2025, in corresponding Chinese Application No. 202210760947.7, 14 pages.
(Continued)

*Primary Examiner* — Tong-Ho Kim
(74) *Attorney, Agent, or Firm* — Maier & Maier, PLLC

(57) ABSTRACT

A flexible display panel includes a pixel definition layer, a partition wall, and a first electrode. The partition wall is disposed on the pixel definition layer and located within the pixel island area. Each pixel island area includes at least one partition wall. The first electrode is disposed on the pixel definition layer. A width of the partition wall continuously decreases or intermittently changes from top to bottom along a thickness direction of the partition wall. The first electrode includes a plurality of patterned islands that are in one-to-one correspondence with the plurality of pixel island areas and are spaced apart by the partition walls.

20 Claims, 6 Drawing Sheets

(51) Int. Cl.
*H10K 59/80* (2023.01)
*H10K 102/00* (2023.01)

(58) Field of Classification Search
CPC .... H10K 59/00; H10K 77/111; H10K 50/805; H10K 71/00; H10K 59/1213; H10K 59/131; H10K 59/8051; H10K 59/80521; H10K 59/87; H10K 71/60; H10K 71/621; G09F 9/301
USPC .......................................................... 257/72
See application file for complete search history.

(56) References Cited

U.S. PATENT DOCUMENTS

| | | | | |
|---|---|---|---|---|
| 2022/0077251 | A1* | 3/2022 | Choung | H10K 59/173 |
| 2023/0122827 | A1* | 4/2023 | Hyun | H10K 50/8428 257/91 |

FOREIGN PATENT DOCUMENTS

| | | | |
|---|---|---|---|
| CN | 110767721 | A | 2/2020 |
| CN | 111063721 | A | 4/2020 |
| CN | 111312921 | A | 6/2020 |
| CN | 111566834 | A | 8/2020 |
| CN | 111684616 | A | 9/2020 |
| CN | 112838103 | A | 5/2021 |
| CN | 113270467 | A | 8/2021 |
| WO | 2021196919 | A1 | 10/2021 |
| WO | 2022050983 | A1 | 3/2022 |

OTHER PUBLICATIONS

International Search Report mailed on Mar. 3, 2023, in corresponding International Application No. PCT/CN2022/122160, 6 pages.
Written Opinion of the International Searching Authority mailed on Mar. 3, 2023, in corresponding International Application No. PCT/CN2022/122160, 6 pages.
Office Action issued on Nov. 13, 2024, in corresponding Korean Application No. 10-2024-7004677, 15 pages.

* cited by examiner forming partition walls on the pixel definition layer, wherein the partition walls are located within the pixel island areas, each pixel island area includes at least one partition wall, and the partition walls continuously decrease or intermittently change in width from top to bottom along a thickness direction of the partition walls — S150 forming a first electrode on the pixel definition layer, wherein the first electrode is patterned into a plurality of patterned islands through the partition walls, the plurality of patterned islands are spaced from each other, and are in one-to-one correspondence with the plurality of pixel island areas — S160

FIG. 10

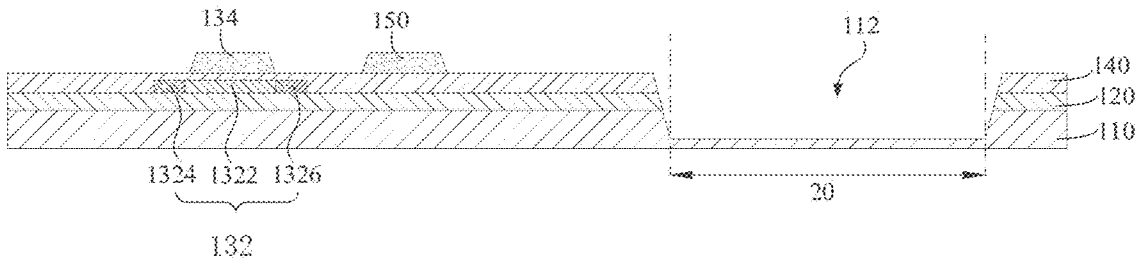

FIG. 11

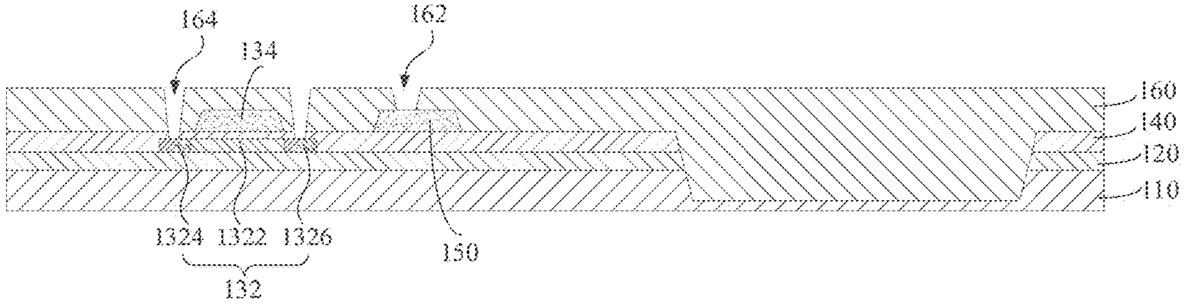

FIG. 12

FLEXIBLE DISPLAY PANEL, METHOD FOR PREPARING THE SAME, AND STRETCHABLE DISPLAY DEVICE

CROSS-REFERENCE TO RELATED APPLICATIONS

This application is a continuation of international patent application No. PCT/CN2022/122160, filed on Sep. 28, 2022, which claims priority to Chinese Patent Application No. 202210760947.7, entitled “FLEXIBLE DISPLAY PANEL, METHOD FOR PREPARING THE SAME, AND STRETCHABLE DISPLAY DEVICE” filed on Jun. 30, 2022. The contents of the above identified applications are hereby incorporated herein by reference in their entireties.

TECHNICAL FIELD

The present application relates to the technical field of display technology, in particular to a flexible display panel, a method for preparing the same, and a stretchable display device.

BACKGROUND

In recent years, with the development of society, science, and technology, users' demands for display devices of electronic equipment have increasingly diversified. More and more attentions have been paid to stretchable display devices, as one of the important development directions in the display devices. Organic light-emitting diode (OLED) display devices are therefore being widely used due to their advantages such as good bendability and flexibility.

SUMMARY

In view of the above, there is a need to provide a flexible display panel, a method for preparing the same, and a stretchable display device, which can avoid using of a fine metal mask during the electrode patterning process, thereby reducing production cost, and improving production efficiency.

According to an aspect of the present application, a flexible display panel is provided. The flexible display panel includes a plurality of pixel island areas spaced from each other. The flexible display panel includes a pixel definition layer, partition walls, and a first electrode. The partition walls are disposed on the pixel definition layer and located within the pixel island areas. At least one partition wall is disposed in each pixel island area. The first electrode is disposed on the pixel definition layer.

The partition walls continuously decrease or intermittently change in width from top to bottom along a thickness direction of the partition walls. The first electrode includes a plurality of patterned islands. The plurality of patterned islands are in one-to-one correspondence with the plurality of pixel island areas and are spaced apart by the partition walls.

In the above-described flexible display panel, the widths of the partition walls are designed to continuously decrease or intermittently change from top to bottom along the thickness direction of the partition walls. Thus, during the process of forming the first electrode using evaporation deposition or sputtering, on the one hand, the chance of the first electrode material adhering to the side surfaces of the partition walls can be decreased, and on the other hand, the bonding of the first electrode material on the top surfaces of the partition walls with the first electrode material on the side surfaces of the partition walls can be effectively avoided. As a result, an automatic partition of the first electrode can be achieved, thereby forming a plurality of patterned islands spaced from each other. Moreover, the need for a fine metal mask is eliminated, which reduces the production cost, and therefore the need for frequent replacement and clean of the fine metal mask is also eliminated, which improves the production efficiency.

According to another aspect of the present application, a method for preparing a flexible display panel is provided. The flexible display panel includes a plurality of pixel island areas spaced from each other. The method includes:

- forming partition walls on the pixel definition layer, wherein the partition walls are located within the pixel island areas, at least one partition wall is disposed in each pixel island area, and the partition walls continuously decrease or intermittently change in width from top to bottom along a thickness direction of the partition walls; and
- forming a first electrode on the pixel definition layer, wherein the first electrode is patterned into a plurality of patterned islands through the partition walls, the plurality of patterned islands are spaced from each other, and are in one-to-one correspondence with the plurality of pixel island areas.

According to a further aspect of the present application, a stretchable display device is provided. The stretchable display device includes the flexible display panel in any embodiment as described above.

BRIEF DESCRIPTION OF THE DRAWINGS

The drawings to be used in the description of the embodiments of the present application or the conventional art will be described briefly in order to more clearly illustrate the technical solutions in the embodiments or in the conventional art. Obviously, the drawings described below are only for some embodiments of the present application, and other drawings can also be obtained by those of ordinary skill in the art based on the following drawings without creative work.

FIG. 10 is a flow chart of a method for preparing a flexible display panel in an embodiment of the present application.

FIG. 11 to FIG. 15 are schematic structural views of a flexible display panel in different steps of a method for preparing the flexible display panel according to an embodiment of the present application.

DETAILED DESCRIPTION

Figure 1:
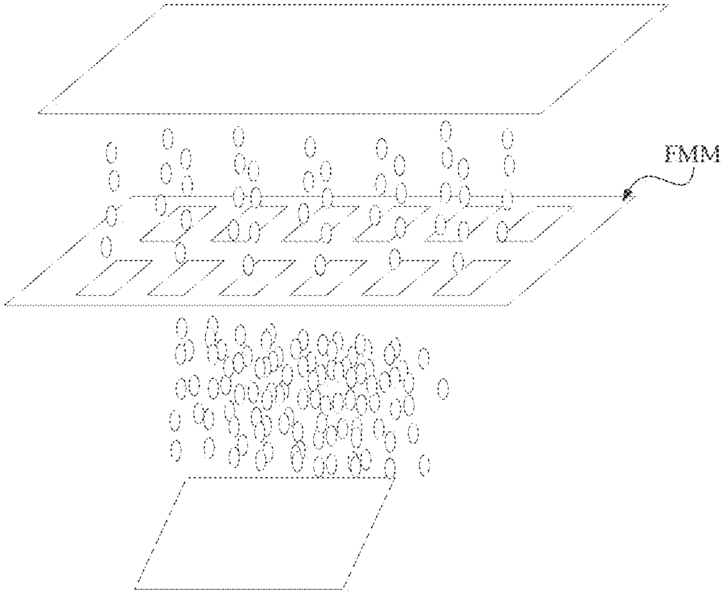
FIG. 1 is a schematic view of a state of patterning a first electrode using a fine metal mask in related art.

Hereinafter, the technical solutions in the embodiments of the present application will be described clearly and completely with reference to the drawings in the embodiments of the present application. Apparently, the described embodiments are only some rather than all of the embodiments of the present application. All the other embodiments obtained by those of ordinary skill in the art without making creative efforts based on the embodiments of the present application shall fall within the scope of protection of the present application.

Unless otherwise defined, all technical and scientific terms used herein have the same meaning as commonly understood by those of ordinary skill in the technical field to which this application belongs. The terms used herein in the description of the present application is for the purpose of describing specific embodiments only and is not intended to limit the present application. As used herein, the term "and/or" includes any or all combinations of one or more of the associated listed items.

As the OLED display panel technology rapidly develops, the OLED display panels are widely used due to their good bendability and flexibility. Compared to the conventional thin film transistor liquid crystal display (TFT-LCD) technology, one significant advantage of the OLED is the ability to form foldable, flexible, or stretchable products.

The OLED display panels usually include multiple grid lines and multiple data lines cross-arranged on a substrate, surrounding display units arranged in a matrix. Each display unit includes both of a thin-film transistor (TFT) and an organic light-emitting diode (OLED), as well as corresponding wiring. This structure is characterized in high pixel density and dense wiring, and therefore is prone to appearing display defects in realizing stretchability or flexibility.

In some related arts, an island-bridge structure is adopted to address this issue. Specifically, the substrate can include a plurality of island-shaped members spaced from each other and a plurality of bridges connecting the plurality of island-shaped members. For example, in some embodiments, the plurality of island-shaped members can be repeatedly arranged along a first direction and a second direction different from the first direction to form a grid-shaped pattern. A plurality of display units can be arranged on the plurality of island-shaped members in one-to-one correspondence, and be encapsulated by a plurality of encapsulating units in one-to-one correspondence. Each display unit can include one sub-pixel for emitting red light, blue light, green light, and/or white light, or include a plurality of sub-pixels for emitting lights with different colors.

Each sub-pixel can include a thin film transistor and an OLED structure, and each OLED structure is controlled by the thin film transistor to emit or not emit light. The OLED structure can include at least a first electrode, a second electrode arranged opposite to the first electrode, and an intermediate layer disposed between the first electrode and the second electrode. The first electrode is usually a continuous whole layer, and is configured to provide electrons for the OLED structure. The second electrode can be electrically connected to a source electrode or a drain electrode of the thin film transistor.

In order to effectively provide electrons, the first electrode is typically made of a low work function metal or a combination of a low work function metal and a high work function metal with stable chemical properties. For example, the first electrode can be made of a low function metal, such as silver, lithium, magnesium, calcium, strontium, aluminum, indium, etc., or a compound or an alloy thereof. However, research has shown that due to limitations in material development, the first electrode in the form of the continuous whole layer in the related design lacks sufficient stress tolerance and ductility during the bending and stretching of the display panel, which results in damage of the first electrode during the bending or stretching of the panel, thereby making the corresponding sub-pixels unable to display.

In other related arts, the first electrode is patterned to be a plurality of islands connected to each other, so that the islands can be the flowing modules when the panel is stretched or bent, thereby preventing the first electrode from breaking or damage, and thus increasing the stress tolerance and ductility of the first electrode. Taking a top-emitting OLED display panel as an example, the layer of the first electrode cannot be patterned through a conventional etching process. Instead, an evaporation deposition process with a mask plate is used. As shown in FIG. 1, a first electrode material is placed in a vacuum environment. A mask plate is arranged between the cavity for evaporating the first electrode material and the display substrate to be deposited with. The mask plate includes openings corresponding to the areas for deposition, and the areas where deposition is not required do not have any openings. The evaporated or sublimated first electrode material travels through the openings and attached to the display substrate to be deposited with, thereby forming a patterned first electrode. The mask plate that is used to correspondingly deposit the first electrode pattern is a fine metal mask (FMM), abbreviated as a fine mask. However, producing the fine metal mask is very difficult, expensive, and results in high production cost. Besides, the metal material of the first electrode can easily stick to the fine mask, and thus the fine mask needs to be replaced and cleaned frequently, thereby affecting the production efficiency.

Therefore, there is a need to provide a flexible display panel capable of patterning the first electrode into a pattern including a plurality of islands without using a fine metal mask, thereby reducing the production cost, and improving the production efficiency.

The display panel in embodiments of the present application will be described below in detail with reference to the accompanying drawings. For convenience of description, the drawings only show structures related to the embodiments of the present application.

Figure 2:
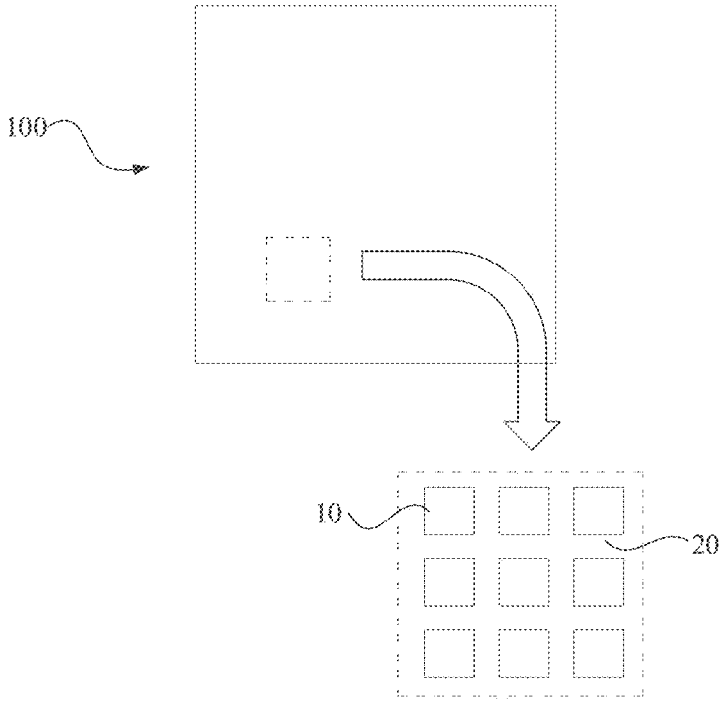
FIG. 2 is a schematic structural view of a flexible display panel in an embodiment of the present application.
Figure 3:
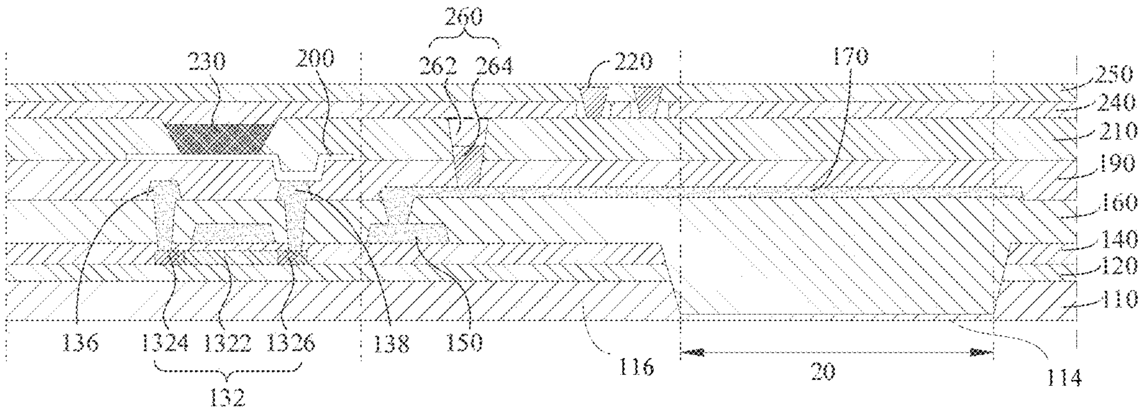
FIG. 3 is a schematic sectional view of a flexible display panel in an embodiment of the present application.

Referring to FIG. 2 and FIG. 3, the flexible display panel 100 in at least one embodiment of the present application includes a plurality of pixel island areas 10 spaced from each other and a flexible area 20 located between adjacent pixel island areas 10. Specifically, the pixel island areas 10 can be rigid areas, serving as the effective display areas of the flexible display panel. The flexible area 20 can be a stretchable or bendable area.

The flexible display panel includes a pixel definition layer 210, partition walls 220, and a first electrode 240. The partition walls 220 are arranged on the pixel definition layer 210 and located within the pixel island areas 10. At least one partition wall 220 is disposed in each pixel island area 10. Along the thickness direction of the partition walls 220, the width of the partition walls 220 continuously decreases or intermittently changes from top to bottom. The first electrode 240 includes a plurality of patterned islands, which are in one-to-one correspondence with the pixel island areas 10 and are spaced apart by the partition walls 220.

For example, as shown in FIG. 3, along the thickness direction of the partition walls 220, the width of the partition walls 220 continuously decreases from the top surface to the bottom surface of the partition walls 220. Along the thickness direction of the partition walls 220, the longitudinal sectional shape of the partition wall 220 can be an inverted trapezoid. Of course, in some other embodiments, the longitudinal section of the partition wall 220 in the thickness direction can also be in other shapes. For example, the side edge of the longitudinal section can be in but is not limited to, an arc shape, a parabola shape, or other continuous curved shape.

The thickness of the partition wall 220 is equal to the distance between the top surface and the bottom surface of the partition wall 220. Since the partition wall 220 is of a three-dimensional structure, at different thickness positions in the longitudinal section perpendicular to the extending direction of the partition wall 220, the partition wall 220 can have different widths. Therefore, the widths of the partition wall 220 defined in the embodiment of the present application can be understood to be width sizes of orthographic projections of the cross-sections corresponding to different thickness positions of the partition wall 220, projected on the pixel definition layer 210; that is, the widths of the partition wall 220 are the sizes of the orthographic projections of the cross-sections in the direction perpendicular to the extending direction of the partition wall 220.

In the preparation process of the display panel, films and layers are laminated one by one. A later formed film or layer is regarded as an "upper" film or layer located "above" a previously formed film or layer. Correspondingly, a previously formed film or layer is regarded as a "lower" film or layer located "below" a later formed film or layer. Therefore, when a layer is referred to as being an "upper" or "lower" layer located "above" or "below" another layer, it is on the basis of the relative positions of the layers when the layers are laminated. Therefore, when being referred to as from top to bottom in the embodiments of the present application, it refers to the direction from the top surface to the bottom surface of the partition wall 220.

It can be understood that during forming of the first electrode 240 by evaporation deposition or sputtering, due to uncertain movement directions of the metal atoms, the first electrode material can be easily formed on the side surfaces of the partition walls 220. In addition, the formed first electrode material adheres firmly to the side surfaces of the partition walls 220, and is not easy to fall off. The inventors of the present application discovered through research and development that when the width of the partition walls 220 is designed to continuously decrease or intermittently change along the thickness direction of the partition walls 220, one the one hand, the chance of the first electrode material adhering to the side surfaces of the partition walls 220 can be decreased, and on the other hand, the bonding of the first electrode material on the top surfaces of the partition walls 220 with the first electrode material on the side surfaces of the partition walls 220 can be effectively avoided. As a result, an automatic partition of the first electrode 240 can be achieved, thereby forming a plurality of patterned islands spaced from each other. As such, the need for a fine metal mask is eliminated, which reduces the production cost, and therefore the need for frequent replacement and clean of the fine metal mask is also eliminated, which improves the production efficiency.

Taking the longitudinal sectional shape of the partition wall 220 in the thickness direction being an inverted trapezoid as an example, as shown in FIG. 3, on the one hand, the first electrode material from top to bottom cannot be continuously formed on the side surfaces of the partition walls 220 during the sputtering or the evaporation deposition; on the other hand, an acute angle is formed between the top surface and the side surface of the partition wall 220. The acute angle can cause the first electrode material to be partitioned automatically, thereby further avoiding the bonding of the first electrode material on the top surface of the partition wall 220 with the first electrode material on the side surface of the partition wall 220.

In some embodiments, when an encapsulating layer 250 or other films or layers are formed via the evaporation deposition, the height of the partition walls 220 needs to be substantively the same as the height of the support columns (SPC) for supporting the mask plate, in consideration of the shadow effect of the evaporation deposition. In an embodiment, the thickness of the partition walls 220 is in a range from 0.1 microns to 15 microns.

Figure 4:
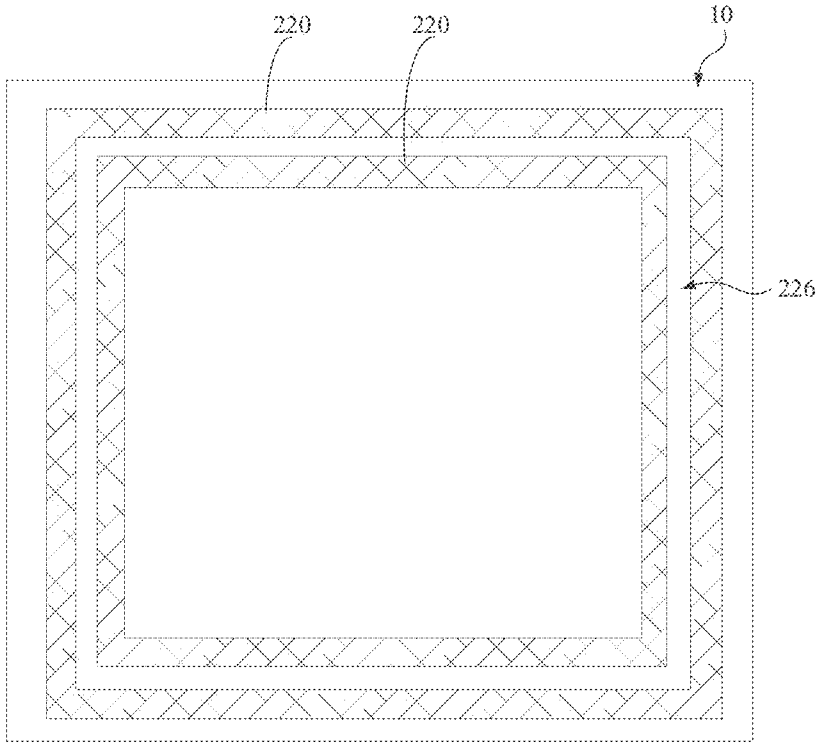
FIG. 4 is a top view of partition walls in an embodiment of the present application.

It should be understood that, as mentioned above, during forming of the first electrode 240 by the sputtering or evaporation deposition, due to the uncertain movement directions of the metal atoms, the first electrode material 240 adheres firmly to the side surfaces of the partition walls 220 and thus is not easy to fall off. Therefore, there may still be a risk that the first electrode material on the top surfaces of the partition walls 220 and the first electrode material on the side surfaces of the partition walls 220 are bonded together. To further address this issue, as shown in FIG. 4, in some other embodiments, the partition walls 220 are constructed to be in continuous annular shapes, and multiple partition walls 220 are formed in a same pixel island area 10. The multiple partition walls 220 are spaced from each other and surround a corresponding patterned island. Therefore, the multiple partition walls 220 together generate the partition effect, thereby ensuring the yield of the patterned first electrode 240. For example, each patterned island is located at an inner side of the partition wall 220 which is most adjacent to the center of the corresponding pixel island area 10.

Further, as shown in FIG. 4, an annular partition groove 226 is formed between two annular partition walls 220 which are spaced apart and adjacent to each other, so that the first electrode 240 is interrupted at the partition groove 226, thereby increasing the probability of separation in the first electrode 240. Specifically, the partition groove 226 has a first end away from the pixel definition layer 210 and a second end adjacent to the pixel definition layer 210. The width of the first end of the partition groove 226 is smaller than the width of the second end of the partition groove 226. As a result, the chance of the first electrode 240 entering the partition groove 226 during the magnetron sputtering or the evaporation deposition is decreased, as the width of the first end (upper end) of the partition groove 226 is smaller than the width of the second end (lower end) of the partition groove 226. Therefore, the thickness of the first electrode material in the partition groove 226 is thinner than the thickness of the first electrode material elsewhere, so that the probability of the first electrode material adhering to the side surface of the partition groove 226 is further reduced, thereby improving the yield of the patterned first electrode 240.

As an embodiment, the width of the first end of the partition groove 226 is in a range from 0.5 microns to 1 micron, which reduces the chance that the first electrode enters the partition groove 226 during the magnetron sputtering or the evaporation deposition to a lower level, thereby further increasing the probability of separation in the first electrode 240.

At present, the etching technology is a relatively mature patterning technology.

Figure 5:
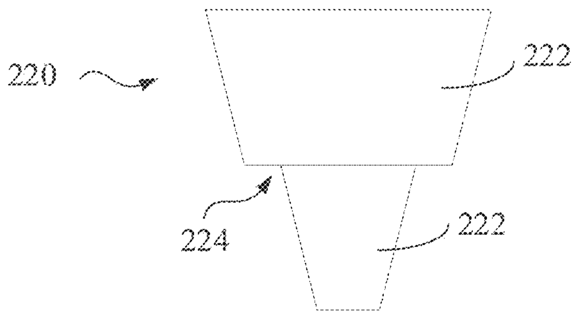
FIG. 5 is a schematic sectional view of a partition wall in an embodiment of the present application.
Figure 6:
FIG. 6 is a schematic sectional view of a partition wall in another embodiment of the present application.
Figure 7:
FIG. 7 is a schematic sectional view of a partition wall in a yet another embodiment of the present application.

However, due to limitations of etching materials and equipment, it is difficult to form such as a relatively acute angle for the side surface of the "inverted trapezoid" partition wall 220, which may increase the complexity of the process or increase the difficulty of partitioning the first electrode 240. In some embodiments, as shown in FIG. 5 to FIG. 7, the partition wall 220 includes a plurality of laminated partition layers 222. Along the thickness direction of the partition walls 220, the widths of at least two adjacent partition layers 222 change intermittently from top to bottom to form a step 224. The width of the bottom surface of the partition layer 222 constituting the step 224 and located at an upper side is greater than the width of the top surface of the partition layer 222 constituting the step 224 and located at a lower side. Thus, during the forming of the first electrode 240 by a top-down evaporation deposition or sputtering, the first electrode material is difficult to adhere to the step 224 formed by the partition layers 222, thereby effectively partitioning the first electrode material, and avoiding the bonding of the first electrode material on the top surface of the partition wall 220 with the first electrode material on the side surface of the partition wall 220.

It should be understood that the adjacent partition layers 222 can form a step 224 with an upward opening or a downward opening due to their different widths at the surfaces where they are in contact with each other. For example, in one embodiment, the width of the bottom surface of the partition layer 222 constituting the step 224 and located at an upper side is smaller than the width of the top surface of the partition layer 222 constituting the step 224 and located at a lower side, so that the step 224 with an upward opening is formed. However, in the actual preparation process, the first electrode material can still be deposited or sputtered onto the side surfaces and the top surfaces of the partition layers 222, and thus there is still a risk that the first electrode 240 cannot be partitioned. Thus, in one embodiment, the partition wall 220 has intermittently changed widths from top to bottom, that is, a wider top and a narrower bottom to form the step, as described in the above embodiment, the first electrode 240 can be effectively partitioned.

It can be understood that an etching process can be used when the width of the partition wall 220 either continuously decreases or intermittently changes along the thickness direction of the partition wall 220 to form the step 224. For example, as shown in FIG. 3, the partition wall 220 is made of a metal material, such as a silver material. Along the thickness direction of the partition wall 220, the width of the partition wall 220 continuously decreases from the top surface to the bottom surface. In this case, the partition wall 220 can be shaped by using a mask and a wet-etching process.

Figure 8:
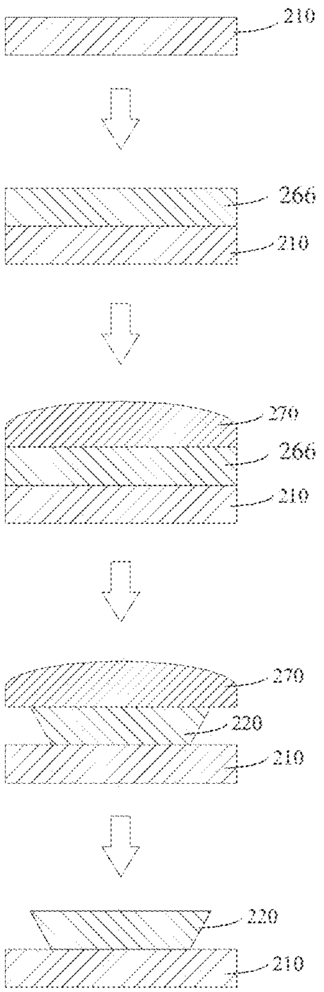
FIG. 8 is a schematic process view of forming a partition wall in an embodiment of the present application.

Specifically, as shown in FIG. 8, first, a silver film layer 266 with a thickness ranged from 0.1 microns to 15 microns can be formed on the pixel definition layer 210.

Next, a negative photoresist 270 is coated on the silver film layer 266, and then the silver film layer 266 is exposed and developed.

Finally, the silver film layer 266 after exposure and development is wet-etched, and the cross-linked negative photoresist 270 is removed, thereby forming the partition wall 220 with the inverted trapezoidal shaped longitudinal section.

In some other embodiments, along the thickness direction of the partition wall 220, the widths of at least two adjacent partition layers 222 intermittently change from top to bottom to form a step. In this case, the two adjacent partition layers 222 constituting the step can be made of the same material. For example, as shown in FIG. 5, a "larger" upper partition layer and a "smaller" lower partition layer can be formed by using two photolithography steps to change the exposure range, forming the two partition layers constituting the step 224. The forming process is simple and has a low cost. Specifically, the upper and lower inverted trapezoidal partition layers 222 can both be made of the negative photoresist due to its easily shaped characteristic and good insulation. The lower partition layer 222 can be firstly formed, and after that, the exposure range can be increased to control the width. As a result, the two inverted trapezoidal partition layers 222 can be formed. Of course, the two adjacent partition layers constituting the step can be made of different materials. For example, as shown in FIG. 6, the partition wall 220 is a laminated structure, formed by two titanium film layers and one aluminum film layer between the two titanium film layers. The widths of the adjacent partition layers 222 intermittently change from top to bottom to form the step. For example, the width of the titanium film layers is greater than the width of the aluminum film layer. In this case, at least two masks can be used, and one dry etching process and one wet etching process are performed for shaping. In another example, as shown in FIG. 7, the partition wall 220 includes a partition layer **222*a* made of an organic photosensitive material and a hard mask 222*b*. Along the thickness direction of the partition wall 220, the step 224** can be formed through an organic positive photolithography process and a hard mask process.

Figure 9:
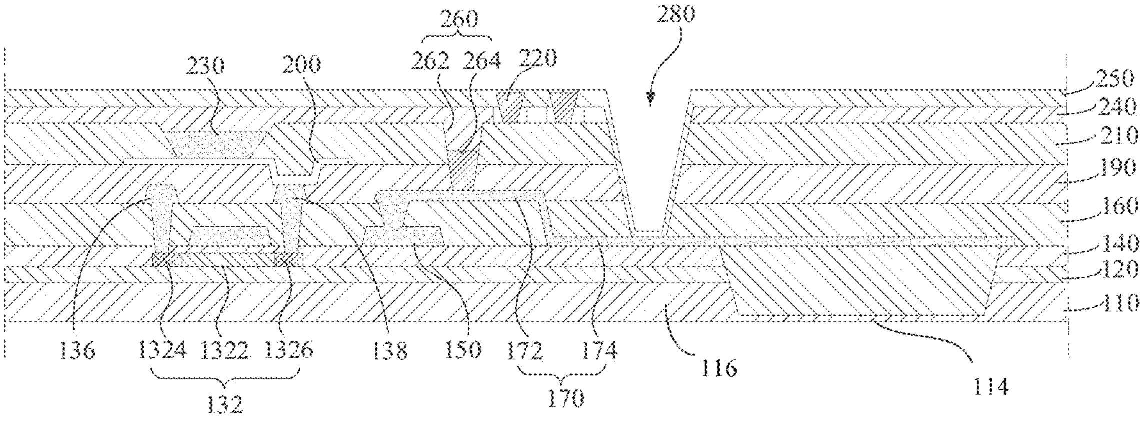
FIG. 9 is a schematic sectional view of a flexible display panel in another embodiment of the present application.

As shown in FIG. 3 and FIG. 9, in some embodiments, the flexible display panel 100 further includes a substrate 110. The substrate 110 can include a plurality of island portions 116 and a bridge 114. The bridge 114 is located within the flexible area 20 and is configured for connecting adjacent island portions 116. The plurality of island portions 116 are spaced from each other and respectively correspond to the plurality of pixel island areas 10. The plurality of island portions 116 can be spaced from each other by a predetermined gap, and can have a flat upper surface. The sub-pixels are respectively arranged on the flat upper surfaces of the corresponding island portions 116. The plurality of island portions 116 can be integrally formed with a plurality of bridges 114. The substrate 110 can include a flexible material, and the flexible material is a material that can be easily bent, folded, or rolled. In some embodiments, the substrate 110 can include a flexible material, such as ultra-thin glass, metal, or plastic. In some other embodiments, the substrate 110 can be made of an elastic and ductile organic material, such as polyimide (PI). Of course, the substrate 110 is not limited to polyimide, and can include various other elastic and ductile organic materials. In some embodiments, the bridge 114 can entirely fill the flexible area 20 between the adjacent island portions 116. That is, the island portions 116 can be a plurality of protrusions that are spaced from each other and formed on the substrate 110. In some other embodiments, the bridge 114 may not entirely fill the flexible area 20 between the adjacent island portions 116, and instead, the bridge 114 can extend along a straight line or a curved line in a plane to connect the adjacent island portions 116. In this case, a hollow area is defined between adjacent bridges 114. In a further embodiment, the substrate 110 can be an integrated patterned structure with meshes, so that the substrate 110 has relatively high flexibility.

It can be understood that as the flexible area 20 exists between the island portions 116 of the substrate 110, when an external force exerts onto the display panel, the flexible area 20 can be stretched and deformed. For example, the plurality of bridges 114 can change their shape and increase their length in response to the external force, and can return to their original shape when the external force is removed. As such, the gaps between the plurality of island portions 116 can be changed, and the shape of the substrate 110 can be changed two-dimensionally or three-dimensionally. Thereby, the shape of the island portion 116 can remain unchanged during the stretching or bending process, and the display unit on the island portion 116 will not be damaged, so that the flexible display panel 100 can have the stretching or bending function.

In some embodiments, the flexible display panel 100 can further include a driving layer group and a display layer group formed on the substrate 110. The driving layer group includes a pixel circuit, which is located within the pixel island area. The pixel circuit can include a thin film transistor. The display layer group can include an OLED structure. The thin film transistor can include a switching thin film transistor and a driving thin film transistor. It should be noted that the specific structure and principle of the pixel circuit are well known to those skilled in the art and are not key points of this application, and thus they are not described in detail herein. Further, for convenience of description, only the driving thin film transistor is shown in the drawings. Therefore, the driving thin film transistor is referred to as a thin film transistor in the following description.

In some embodiments, referring to FIG. 3 and FIG. 9, the flexible display panel further includes a plurality of electrode wires 170, a plurality of first contact holes 180 (as labeled in FIG. 14), and electrical connection portions 260. The electrical connection portions 260 are provided in the first contact holes 180 in one-to-one correspondence. The driving layer group is located between the substrate 110 and the pixel definition layer 210. The driving layer group can include at least two organic functional layers laminated in sequence. The electrode wires 170 are located between the two adjacent organic functional layers. Each patterned island is electrically connected to the corresponding electrode wire 170 through the electrical connection portion 260 which is provided in the first contact hole 180 and provides voltage through the electrode wire 170. In this case, the stress of the electrode wires 170 can be released during the stretching process, thereby improving the tensile resistance and bending resistance of the electrode wires 170, avoiding breakage of the stretched wire due to the stress, thereby improving the stretchability of the flexible display panel.

For example, each patterned island is electrically connected to the corresponding electrode wire 170 through the electrical connection portion 260 provided in one first contact hole 180. Of course, in order to ensure that the patterned island of the first electrode is reliably connected to the electrode wire, each patterned island can be electrically connected to the corresponding electrode wire 170 through the electrical connection portions 260 provided in at least two first contact holes 180.

In some embodiments, as shown in FIG. 3 and FIG. 9, the OLED structure can include the above-described first electrode 240, a second electrode 200 arranged opposite to the first electrode 240, and an intermediate layer 230. The intermediate layer 230 is located between the first electrode 240 and the second electrode 200. Specifically, the first electrode 240 can be electrically connected to a voltage line 150 through the electrode wire 170, and a voltage applied to the first electrode 240 can be lower than that applied to the second electrode 200. Taking top emission as an example, the first electrode 240 can be a cathode and a transmissive electrode. Taking bottom emission as an example, the first electrode 240 can be a reflective electrode. The first electrode 240 can be made of a low work function metal, such as silver, lithium, magnesium, calcium, strontium, aluminum, indium, etc. Alternatively, the first electrode 240 can be a single-layer structure or a multi-layer structure made of metal compounds or alloy materials. The second electrode 200 can be an anode. The thin film transistor can include a source electrode 136 and a drain electrode 138. The second electrode 200 can be electrically connected to the source electrode 136 or the drain electrode 138 of the thin film transistor through a conductive material in a second contact hole. The second electrode 200 can be a transparent electrode, a semi-transparent electrode, or a reflective electrode. For example, when the second electrode 200 is a transparent electrode, the second electrode 200 can include indium tin oxide (ITO), indium zinc oxide, zinc oxide, indium trioxide, indium potassium oxide, aluminum zinc oxide, etc. When the second electrode 200 is a reflective electrode, the second electrode 200 can include silver, magnesium, aluminum, platinum, gold, nickel, etc.

As an embodiment, the electrode wire 170 and the second electrode 200 can be completely arranged in a same layer. In some other embodiments, as shown in FIG. 3, the electrode wire 170 and the source electrode 136 can be arranged in a same layer, and the electrode wire 170 and the drain electrode 138 can be arranged in a same layer.

In some embodiments, the intermediate layer 230 includes at least an organic light-emitting layer. The organic light-emitting layer can be formed by a low molecular weight organic material or an organic polymer material. Specifically, the intermediate layer 230 can further include functional films or layers, such as a hole transport layer, a hole injection layer, an electron transport layer, and an electron injection layer. In a specific embodiment, the material of the hole injection layer can be a free radical emitting material, allowing for relatively good energy level matching among the hole injection layer, the first electrode 240, and the hole transport layer, thereby effectively improving the hole injection capacity, and further improving the performance of organic electroluminescent display panels. Of course, the material of the hole injection layer includes but is not limited to the free radical emitting material, and can be such as HAT-CN. The material of the electron injection layer can be lithium fluoride, lithium oxide, lithium boron oxide, potassium silicate, cesium carbonate, or metal acetates.

In some embodiments, as shown in FIG. 3 and FIG. 9, the driving layer group can include an inorganic functional layer and at least two organic functional layers laminated in sequence. The flexible display panel 100 further includes an encapsulating layer 250. The encapsulating layer 250 covers the side of the first electrode 240 away from the substrate 110. The encapsulating layer 250 can include a plurality of encapsulating units. Each encapsulating unit can encapsulate the display unit of the pixel island area 10. Of course, in some other embodiments, the encapsulating layer 250 can encapsulate the entire surface. The encapsulating layer is not limited herein. It can be easily understood that since the organic light-emitting layer is very sensitive to external environments such as water vapor, oxygen, etc., and if the organic light-emitting layer of the display panel is exposed to an environment containing water or oxygen, the performance of the display panel will be significantly decreased or completely damaged. The encapsulating layer 250 can block air and water for the organic light-emitting layer, thereby ensuring the reliability of the display panel.

It can be understood that, for the flexible display panel 100, the encapsulating layer 250 can be a thin film encapsulating layer 250. The thin film encapsulating layer 250 can be a structure with one layer or multiple layers, and can be an organic film layer or an inorganic film layer. As an embodiment, the encapsulating layer is a laminated structure of an organic encapsulation film layer and an inorganic encapsulation film layer. The organic encapsulation film layer provides flexibility. The inorganic encapsulation film layer acts as a barrier against water and oxygen. For example, the thin film encapsulating layer 250 can include two inorganic encapsulation film layers, and an organic encapsulation film layer between the two inorganic encapsulation film layers.

In some embodiments, as shown in FIG. 9, the electrode wire 170 can include a first portion 172 located between two adjacent organic functional layers, and a second portion 174 located between an inorganic functional layer and the adjacent organic functional layer. Each patterned island is electrically connected to the corresponding first portion 172 of the electrode wire 170 through the electrical connection portion 260 arranged in the first contact hole 180. The flexible display panel 100 is provided with an annular partition groove 280 that exposes the second portion 174 and the inorganic functional layer. The annular partition groove 280 is provided in the pixel island area 10. The inorganic encapsulation film layer material of the encapsulating layer 250 fills the annular partition groove 280 and is in contact with the inorganic functional layer. As such, an encapsulating structure surrounding the sub-pixel can be formed. The encapsulating structure together with the inorganic functional layer, can prevent water and oxygen from intruding, thereby further improving the reliability of the flexible display panel. For example, each patterned island can be electrically connected to the first portion 172 of the corresponding electrode wire 170 through the electrical connection portions 260 arranged in at least two first contact holes 180, thereby improving the reliability of connection.

In some embodiments, as shown in FIG. 3 and FIG. 9, the electrical connection portion 260 includes a first contact layer 262 in contact with the patterned island, and a second contact layer 264 in contact with the electrode wire 170. The material of the first contact layer 262 is the same as the material of the first electrode 240. The material of the second contact layer 264 is the same as the material of the partition wall 220. The second contact layer 264 can be formed in the first contact hole 180 during the formation of the partition wall 220. As a result, the disconnection between the patterned island and the electrode wire 170 caused by excessive depth of the first contact hole 180 can be avoided, thereby improving the reliability of the flexible display panel 100. Optionally, the electrical resistivity of the material of the first contact layer 262 is greater than the electrical resistivity of the material of the second contact layer 264. That is, the partition wall 220 can be made of a material with a relatively small electrical resistivity, for example at least one metal selected from gold, silver, aluminum, molybdenum, chromium, titanium, nickel, copper, etc., or a metal alloy thereof, or nanometal thereof. Thus, the voltage drop (IR drop) in the patterned islands connected to different electrode wires 170 can be reduced, and electrical signals have less loss during transmission, thereby improving the display quality.

In the embodiment in which each patterned island is electrically connected to the corresponding electrode wire 170 through the electrical connection portions 260 arranged in at least two first contact holes 180, all or some of the at least two first contact holes 180 can have the same depth, or the at least two first contact holes 180 have different depths. Based on the first contact holes 180 with different depths, the electrical connection portions 260 can be made of the same conductive material, or can be the first contact layer 262 and the second contact layer 264 with different materials as described in the above embodiment. For example, in some embodiments, for the first contact hole 180 with a shallow depth, the electrical connection portion 260 can be made of the first electrode material or be made of the same material as the partition wall 220. For the first contact hole 180 with a deep depth, as described in the above embodiment, the material of the first contact layer 262 is the same as the material of the first electrode 240, and the material of the second contact layer 264 is the same as the material of the partition wall 220.

The electrical connection portion 260 can be a conductive material filling the first contact hole 180, or a conductive material merely covering the inner wall of the first contact hole 180. Alternatively, the electrical connection portion 260 can be a conducting wire running through the first contact hole 180. The electrical connection portion 260 is not limited herein.

In some embodiments, each electrode wire 170 is connected to a plurality of patterned islands. For example, as shown in FIG. 2, the pixel island areas 10 are arranged in an array, and the patterned islands are correspondingly arranged in an array. Each electrode wire 170 can be connected to the patterned islands arranged in a row or in a column and in different pixel island areas. In this case, each electrode wire 170 can supply electric power to the patterned islands in a single row or in a single column, thereby decreasing the non-uniformity of electric resistance of the patterned islands, and adjusting the brightness uniformity.

In this embodiment, as shown in FIG. 3, the flexible display panel 100 can include a buffer layer 120. The buffer layer 120 is arranged on the island portion 116 of the substrate 110, and provides the island portion 116 with a flat surface. The buffer layer 120 can include an organic material, such as polyethylene glycol terephthalate (PET), polyethylene naphthalate (PEN), polyacrylate, and/or polyimide, etc., and can be a layered structure of a single layer or multiple laminated layers. Alternatively, the buffer layer 120 can be a layered structure of a single layer or multiple laminated layers, which are made of silicon oxide, silicon nitride, aluminum oxide, aluminum nitride, titanium oxide, or titanium nitride. Alternatively, the buffer layer 120 can be a composite layer of an organic material layer and/or an inorganic material layer.

The thin film transistor is arranged on the buffer layer 120. Each thin film transistor can control the emission of a sub-pixel, or can control the emission amount of a sub-pixel. In some embodiments, the thin film transistor can include an active layer 132, a gate electrode 134 (referring to in FIG. 11), a source electrode 136, and a drain electrode 138. The active layer 132, the gate electrode 134, the source electrode 136, and the drain electrode 138 arranged in one way can form a top-gate thin film transistor. Of course, in some other embodiments, the thin film transistor can be of any other type, such as a bottom-gate thin film transistor. Specifically, in some embodiments, the active layer 132 can include a semiconductor material, such as amorphous silicon or polycrystalline silicon. In some other embodiments, the active layer 132 can include an organic semiconductor material. In still some other embodiments, the active layer 132 can include an oxide semiconductor material, such as zinc oxide, indium oxide, tin oxide, cadmium oxide, etc.

The driving layer group can include a first insulating layer 140. The first insulating layer 140 can cover the active layer 132. Taking the top-gate thin film transistor as an example, the gate electrode 134 can be arranged on the first insulating layer 140 to overlap with the active layer 132, and can be insulated from the active layer 132 by the first insulating layer 140. In consideration of adhesion with adjacent layers, and formability and surface flatness of laminated target layers, the first insulating layer 140 can be made of organic or inorganic insulating materials, such as silicon oxide, silicon nitride, or the like. The gate electrode 134 can be a single-layer structure or a multi-layer structure made of a low-resistance metal material, such as at least one selected from aluminum, platinum, palladium, silver, magnesium, gold, nickel, neodymium, iridium, chromium, calcium, molybdenum, titanium, tungsten, or copper.

The driving layer group can further include a second insulating layer 160. The second insulating layer 160 can be arranged on the gate electrode 134 and the first insulating layer 140. The source electrode 136 and the drain electrode 138 can be arranged on the second insulating layer 160. The insulating layer 160 can insulate the source electrode 136 and the drain electrode 138 from the gate electrode 134. Through holes are provided in the first insulating layer 140 and the second insulating layer 160 to expose a predetermined area of the active layer 132. The source electrode 136 and the drain electrode 138 can be in contact with the active layer 132 through the through holes. The source electrode 136 and the drain electrode 138 can be a single-layer structure or a multi-layer structure made of at least one material selected from aluminum, platinum, palladium, silver, magnesium, gold, nickel, neodymium, iridium, chromium, calcium, molybdenum, titanium, tungsten, or copper.

As an embodiment, the second insulating layer 160 can be a multi-layer structure or a single-layer structure made of an inorganic material. For example, the second insulating layer 160 can include an inorganic oxide or an inorganic nitride, such as silicon oxide, silicon nitride, silicon oxynitride, aluminum oxide, titanium oxide, etc. In this embodiment, the second insulating layer 160 can also be a multi-layer structure or a single-layer structure made of an organic material. For example, the second insulating layer 160 can include an organic material, such as polymethylmethacrylate, polystyrene, an acrylic polymer, an imide polymer, a p-xylene polymer, etc. Of course, the second insulating layer 160 can also be but is not limited to, a multi-layer laminated structure including an inorganic material layer and an organic material layer.

If the thin film transistor or the organic light-emitting layer of the display panel is exposed to water vapor or oxygen, the performance of the display panel may be significantly impaired or the display panel may be completely damaged. The inorganic material layer can be a barrier against water and oxygen, and the organic material layer can provide relatively good flexibility. Therefore, in this embodiment, the buffer layer 120 can be a multi-layer structure made of an organic material and an inorganic material. The first insulating layer 140 can be a single-layer structure or a multi-layer structure made of an inorganic material, such as silicon oxide, silicon nitride, etc. The second insulating layer 160 can be a single-layer structure or a multi-layer structure made of an organic material.

The flexible region 20, as a stretchable or bendable area, should have good flexibility. Therefore, in some embodiments, the buffer layer 120 and the first insulating layer 140 can be located only within the pixel island area 10 because they contain inorganic materials. Referring to FIG. 11, he substrate 110 can include a groove 112 located within the flexible region 20. The material of the organic functional layer in the driving layer group can entirely fill the groove 112 in the flexible region 20. For example, in this embodiment, as shown in FIG. 3, the groove 112 can be entirely filled with the material of the second insulating layer 160. In this case, the stretchability and bendability of the flexible region 20 are further improved.

It can be understood that the sectional shape of the groove 112 can be a rectangular shape, a V-shape, an inverted trapezoidal shape, etc., which is not limited herein.

The driving layer group can further include a passivating layer 190. The passivating layer 190 can be arranged on the second insulating layer 160. The pixel definition layer 210 can be arranged on the passivating layer 190. The passivating layer 190 is configured to planarize the step portion of the thin film transistor and form a flat surface, thereby preventing display defects of the OLED structure due to the unevenness. In this embodiment, the passivating layer 190 can be a single-layer film or a multi-layer film made of an organic material. Examples of the organic material include, for example, general polymers such as polymethylmethacrylate and polystyrene, polymer derivatives with phenol-based groups, acrylic-based polymers, imide-based polymers, aromatic ether-based polymers, or a mixture thereof.

It can be understood that, in some other embodiments, the passivating layer 190 can be a laminated composite structure including an inorganic material layer and an organic material layer. It should be understood that, in order to further improve the stretchability and bendability of the flexible region 20, the use of the inorganic material in the flexible region 20 should be minimized. In one embodiment, the passivating layer 190 is a single-layer structure or a multi-layer structure made of an organic material. In this case, the passivating layer 190 can entirely cover the surface of the second insulating layer 160. On the one hand, the stretchability and bendability of the flexible region 20 are improved. On the other hand, the patterning process of the passivating layer 190 is avoided, thereby reducing the production cost, and improving the production efficiency.

Figure 14:
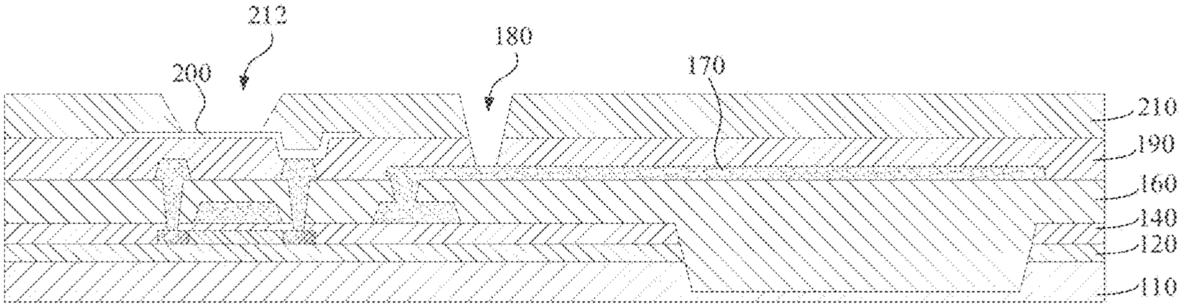

Referring to FIG. 14, the pixel definition layer 210 is arranged on the passivating layer 190. The first electrode 240 is arranged on the pixel definition layer 210. The pixel definition layer 210 is configured to define a plurality of pixel definition openings 212 to expose at least a part of each second electrode 200. The intermediate layer 230 is arranged in the pixel definition opening 212, and is electrically connected to the first electrode 240 and the second electrode 200. Specifically, in some embodiments, the pixel definition layer 210 can cover at least a portion of an edge area of each second electrode 200, thereby exposing at least a portion of each second electrode 200 through the corresponding pixel definition opening 212. As such, the middle part or the entire of the second electrode 200 is exposed through the pixel definition opening 212.

In this embodiment, as shown in FIG. 3, the electrode wire 170 is located between the second insulating layer 160 and the passivating layer 190, and is arranged in the same layer as the source electrode 136 and the drain electrode 138. The corresponding electrode wire 170 can be exposed through each first contact hole 180, so that each patterned island is electrically connected to one corresponding electrode wire 170 through the electrical connection portion 260 in the first contact hole 180, and is electrically connected to the voltage line 150. Specifically, the first contact hole 180 can extend through the laminated pixel definition layer 210 and passivating layer 190. The patterned island and the corresponding electrode wire 170 are electrically connected through the electrical connection portion 260 in the first contact hole 180. That is, the at least two organic functional layers as described above can include the second insulating layer 160 and the passivating layer 190 located on the second insulating layer 160, and the second insulating layer 160 insulates the gate electrode 134 from the source electrode 136 and the drain electrode 138. In this case, the stress of the electrode wire 170 can be released during the stretching process, thereby improving the tensile resistance and bending resistance of the electrode wire 170, avoiding breakage of the stretched wire due to the stress, and improving the stretchability of the flexible display panel 100. It can be understood that the inorganic functional layer in the driving layer group can include the inorganic material film or layer, such as the first insulating layer 140.

In this embodiment, the electrode wire 170 can be made of a metal with low electrical resistivity. For example, the electrode wire 170 can be made of at least one metal selected from such as gold, silver, aluminum, molybdenum, chromium, titanium, nickel, copper, etc. or metal alloys thereof, or nanometal material thereof, thereby decreasing the non-uniformity of electric resistance of the patterned islands connected to different electrode wires 170, and improving the uniformity of display brightness.

The driving layer group further includes a plurality of voltage lines 150. Each voltage line 150 is electrically connected to one electrode wire 170, and each electrode wire 170 is electrically connected to a plurality of patterned islands. For example, each electrode wire 170 can be connected to the patterned islands arranged in a row or in a column, and each electrode wire 170 can be connected to one voltage line 150. In this case, each electrode wire 170 can supply electric power to the patterned islands in a single row or in a single column, thereby decreasing the non-uniformity of electric resistance of the patterned islands, and adjusting the brightness uniformity. Specifically, in some embodiments, as shown in FIG. 12, the driving layer group further includes a third contact hole 162. The voltage line 150 can be exposed through the third contact hole 162, and the voltage line 150 is electrically connected to the corresponding electrode wire 170 through the conductive material in the third contact hole 162. Specifically, in one embodiment, the electrode wire 170 is arranged in the same layer as the source electrode 136 and the drain electrode 138, and the third contact hole 162 extends through the second insulating layer 160, so that the voltage line 150 is electrically connected to the corresponding electrode wire 170.

A method for preparing the flexible display panel 100 in some specific embodiments is described in detail below.

As shown in FIG. 10, an embodiment of the method for preparing the flexible display panel 100 of the present application includes the following steps:

Step S150: form partition walls 220 on a pixel definition layer 210.

The partition walls 220 are located within the pixel island areas. At least one partition wall 220 is disposed in each pixel island area. The width of the partition walls 220 continuously decreases or intermittently changes from top to bottom along the thickness direction of the partition walls 220.

Step S160: form a first electrode 240 on the pixel definition layer 210. The first electrode 240 is patterned into a plurality of patterned islands through the partition walls 220. The plurality of patterned islands are spaced from each other, and are in one-to-one correspondence with the plurality of pixel island areas.

Specifically, along the thickness direction of the partition walls 220, the width of the partition walls 220 continuously decreases and/or intermittently changes, so that the first electrode 240 can be patterned into a plurality of patterned islands through the partition walls 220 during the sputtering or evaporation deposition. The patterned islands are spaced from each other and are in one-to-one correspondence with the pixel island areas. Specifically, the patterned first electrode 240 can be formed by using a common metal mask (CMM).

Along the thickness direction of the partition walls 220, the width of the partition walls 220 is designed to continuously decrease or intermittently change. On the one hand, the chance of the first electrode material adhering to the side surfaces of the partition walls 220 can be decreased; on the other hand, the bonding of the first electrode material on the top surfaces of the partition walls 220 with the first electrode material on the side surfaces of the partition walls 220 can be effectively avoided. As a result, an automatic partition of the first electrode 240 can be achieved, thereby forming a plurality of patterned islands spaced from each other. Moreover, the need for a fine metal mask is eliminated, which reduces the production cost, and therefore the need for requent replacement and clean of the fine metal mask is also eliminated, which improves the production efficiency.

In some embodiments, prior to step S150, the method for preparing the flexible display panel 100 further includes step S110 to step S140.

Step S110: sequentially form a buffer layer 120, an active layer 132, a first insulating layer 140, a gate electrode 134, and a voltage line 150 on the substrate 110, and etch to form a groove 112 in the substrate 110, and the groove 112 is located within the flexible area 20.

Specifically, as shown in FIG. 11, the surface of the substrate 110 is completely covered by the buffer layer 120 and the first insulating layer 140. During the etching process, the buffer layer material and the first insulating layer material within the flexible area 20 can be etched away to form the groove 112 in the substrate 110.

Of course, in some other embodiments, the buffer layer 120 and the first insulating layer 140 can also be patterned, i.e., to be only located in the pixel island areas 10. Thus, in the etching process, only the material of the substrate 110 within the flexible area 20 is etched.

Step S120: form a second insulating layer 160 on the first insulating layer 140, form a third contact hole 162 and fourth contact holes 164 in the second insulating layer 160. The third contact hole 162 is configured for electrical connection between the voltage line 150 and the corresponding electrode wire 170. The fourth contact holes 164 are configured for electrical connections between the source electrode 136 and the active layer 132, and between the drain electrode 138 and the active layer 132. The material of the second insulating layer 160 completely fills the groove 112.

Specifically, as shown in FIG. 12, the active layer 132 includes a channel region 1322, a source region 1324, and a drain region 1326. The source region 1324 and the drain region 1326 are located on the two sides of the channel region 1322. The fourth contact holes 164 extend through the second insulating layer 160 and the first insulating layer 140, so that the source electrode 136 and the drain electrode 138 are electrically connected to the source region 1324 and the drain region 1326 of the active layer 132 respectively through the conductive material in the corresponding fourth contact holes 164.

Step S130: form a source electrode 136, a drain electrode 138, an electrode wire 170, and a passivating layer 190 on the second insulating layer 160, and form a first sub-contact hole 182 in the second insulating layer 160, wherein the first sub-contact hole 182 is configured for electrical connection between the electrode wire 170 and the corresponding patterned island.

Figure 13:
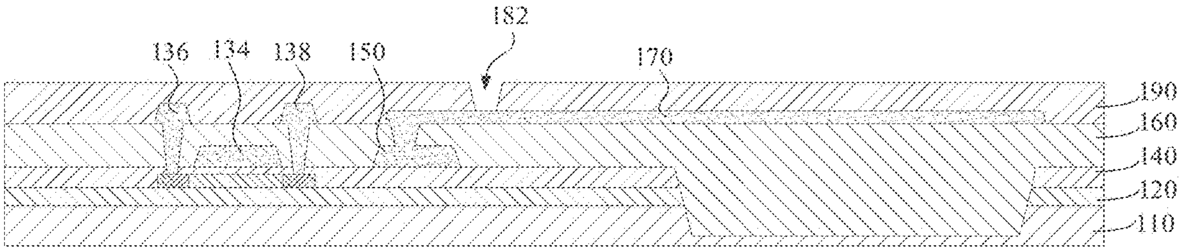

Specifically, as shown in FIG. 13, the source electrode 136, the drain electrode 138, and the electrode wire 170 are formed in the same layer. The source electrode 136 and the drain electrode 138 are respectively electrically connected to the source region 1324 and the drain region 1326 of the active region 132.

Step S140: form a second electrode 200 and a pixel definition layer 210 on the passivating layer 190, and form a second sub-contact hole (not labeled), which is in communication with the first sub-contact hole 182, in the pixel definition layer 210, so that the first sub-contact hole 182 and the second sub-contact hole together form the first contact hole 180.

Specifically, as shown in FIG. 14, the sectional shape of the first contact hole 180 is an inverted trapezoid. The pixel definition layer 210 defines a plurality of pixel definition openings 212. A part of each second electrode 200 is exposed through one pixel definition opening 212.

Figure 15:
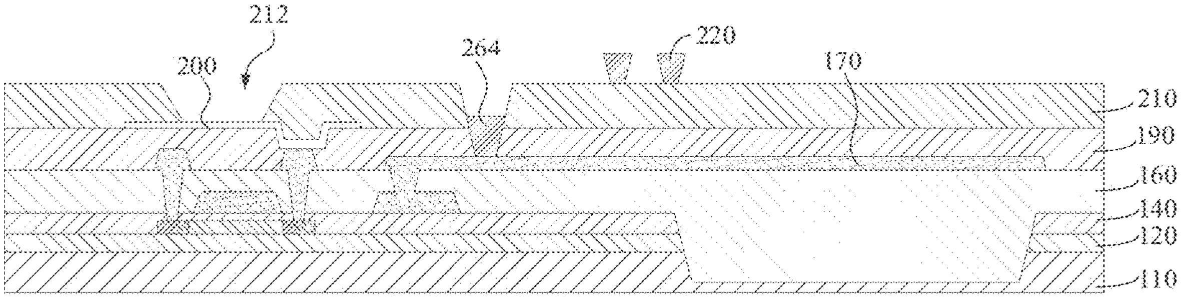

In some embodiments, in step S150, as shown in FIG. 15, the partition wall material is filled in the first contact hole 180 to form a second contact layer 264. Specifically, in this embodiment, two partition walls 220 are formed in each pixel island area 10, and the two partition walls 220 are spaced from each other.

In some embodiments, in step S160, the first electrode material is filled in the first contact hole 180 to form a first contact layer 262.

In some embodiments, prior to step S160, the method for preparing the flexible display panel 100 further includes a step of forming an intermediate layer 230 in the pixel definition opening 212, wherein the patterned island of the first electrode 240 covers the intermediate layer 230.

In some embodiments, after forming the first electrode 240, the method for preparing the flexible display panel 100 further includes a step of forming an encapsulating layer 250 on the first electrode 240.

In an embodiment, as shown in FIG. 9, the inorganic material of the encapsulating layer 250 fills the annular partition groove 280, and the inorganic encapsulation film layer is in contact with the first insulating layer 140. As such, an encapsulating structure surrounding the sub-pixel can be formed, thereby further improving the reliability of the flexible display panel.

Based on the flexible display panel 100, an embodiment of the present application further provides a stretchable display device. The stretchable display device includes the flexible display panel 100 in any embodiment as described above. The stretchable display device can be applied to electronic equipment that involve a stretchable or bendable scenario, such as a wearable device, an automotive equipment, a mobile terminal, a tablet computer, a display panel, etc.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A flexible display panel comprising:

a plurality of pixel island areas spaced from each other, and comprising:

a pixel definition layer;

partition walls, disposed on the pixel definition layer and located within the plurality of pixel island areas, and at least one partition wall being disposed in each pixel island area; and a first electrode, disposed on the pixel definition layer;

wherein;

the partition walls continuously decrease or intermittently change in width from top to bottom along a thickness direction of the partition walls, the first electrode comprises a plurality of patterned islands, the plurality of patterned islands is in one-to-one correspondence with the plurality of pixel island areas and is spaced apart by the partition walls, each patterned island is located at an inner side of one partition wall which is most adjacent to the center of a corresponding pixel island area, the partition walls are annular shaped, each pixel island area comprises two or more partition walls, and the two or more partition walls are spaced from each other and surround a corresponding patterned island.

2. The flexible display panel according to claim 1, wherein along the thickness direction of the partition walls, the partition walls continuously decrease in width from a top surface to a bottom surface of the partition walls.

3. The flexible display panel according to claim 1, wherein along the thickness direction of the partition walls, a longitudinal sectional shape of each partition wall is an inverted trapezoid.

4. The flexible display panel according to claim 1, wherein each partition wall comprises a plurality of laminated partition layers comprising a lower partition layer and an upper partition layer;

along the thickness direction of the partition walls, at least two adjacent partition layers intermittently change in width from top to bottom to constitute a step; and the width of a bottom surface of the upper partition layer is greater than the width of a top surface of the lower partition layer.

5. The flexible display panel according to claim 4, wherein two adjacent partition layers constituting the step are made of a same material.

6. The flexible display panel according to claim 4, wherein two adjacent partition layers constituting the step are made of different materials.

7. The flexible display panel according to claim 1, wherein;

an annular partition groove is defined between two adjacent partition walls spaced from each other;

the partition groove comprises a first end away from the pixel definition layer and a second end adjacent to the pixel definition layer; and a width of the first end of the partition groove is smaller than a width of the second end of the partition groove.

8. The flexible display panel according to claim 1, further comprising:

a substrate;

a driving layer group, disposed between the substrate and the pixel definition layer, the driving layer group comprising at least two organic functional layers laminated in sequence;

a plurality of electrode wires, located between two adjacent organic functional layers;

a plurality of first contact holes and electrical connection portions, the electrical connection portions being disposed in the first contact holes in one-to-one correspondence, the plurality of patterned islands being electrically connected to the electrode wires through the electrical connection portions disposed in the first contact holes.

9. The flexible display panel according to claim 8, wherein each patterned island is electrically connected to a corresponding electrode wire through the electrical connection portions disposed in at least two first contact holes.

10. The flexible display panel according to claim 8, further comprising a second electrode disposed opposite to the first electrode;

the electrode wires and the second electrode are disposed in a same layer.

11. The flexible display panel according to claim 8, wherein the driving layer group further comprises thin film transistors disposed in the pixel island areas, and each thin film transistor comprises a source electrode and a drain electrode; and the electrode wires and the source electrode are disposed in a same layer, and the electrode wires and the drain electrode are disposed in a same layer.

12. The flexible display panel according to claim 8, wherein each electrical connection portion comprises a first contact layer in contact with the patterned island, and a second contact layer in contact with the electrode wire, a material of the first contact layer is the same as a material of the first electrode, and a material of the second contact layer is the same as a material of the partition wall.

13. The flexible display panel according to claim 12, wherein an electrical resistivity of the material of the first contact layer is greater than an electrical resistivity of the material of the second contact layer.

14. The flexible display panel according to claim 8, wherein each electrode wire is connected to more than one patterned island.

15. The flexible display panel according to claim 1, further comprising:

a substrate;

a driving layer group, disposed between the substrate and the pixel definition layer, the driving layer group comprising an inorganic functional layer and at least two organic functional layers laminated in sequence;

a plurality of electrode wires, each of the electrode wires comprising a first portion and a second portion, the first portion being disposed between two adjacent organic functional layers, and the second portion being disposed between the inorganic functional layer and an adjacent organic functional layer;

a plurality of first contact holes and electrical connection portions, the electrical connection portions being disposed in the first contact holes in one-to-one correspondence, the plurality of patterned islands being electrically connected to corresponding first portions of the electrode wires through the electrical connection portions disposed in the first contact holes; and an encapsulating layer covering the first electrode, the flexible display panel being provided with an annular partition groove, the second portion and the inorganic functional layer are exposed from the annular partition groove, the annular partition groove is disposed in the pixel island area, and an inorganic material of the encapsulating layer fills the annular partition groove and is in contact with the inorganic functional layer.

16. The flexible display panel according to claim 15, wherein each patterned island is electrically connected to the first portion of a corresponding electrode wire through the electrical connection portions disposed in at least two first contact holes.

17. A method for preparing the flexible display panel according to claim 1, the flexible display panel comprising a plurality of pixel island areas spaced from each other, the method comprising:

forming partition walls on the pixel definition layer, wherein;

the partition walls are located within the plurality of pixel island areas, at least one partition wall is disposed in each pixel island area, and the partition walls continuously decrease or intermittently change in width from top to bottom along a thickness direction of the partition walls; and forming a first electrode on the pixel definition layer, wherein:

the first electrode is patterned into a plurality of patterned islands through the partition walls, and the plurality of patterned islands is spaced from each other, and is in one-to-one correspondence with the plurality of pixel island areas.

18. A stretchable display device, comprising the flexible display panel according to claim 1.

19. A flexible display panel comprising:

a plurality of pixel island areas spaced from each other, and comprising:

a pixel definition layer;

partition walls, disposed on the pixel definition layer and located within the plurality of pixel island areas, and at least one partition wall being disposed in each pixel island area;

a first electrode, disposed on the pixel definition layer;

a substrate;

a driving layer group, disposed between the substrate and the pixel definition layer, the driving layer group comprising at least two organic functional layers laminated in sequence;

a plurality of electrode wires, located between two adjacent organic functional layers; and a plurality of first contact holes and electrical connection portions, the electrical connection portions being disposed in the first contact holes in one-to-one correspondence, the plurality of patterned islands being electrically connected to the electrode wires through the electrical connection portions disposed in the first contact holes, wherein:

the partition walls continuously decrease or intermittently change in width from top to bottom along a thickness direction of the partition walls, the first electrode comprises a plurality of patterned islands, and the plurality of patterned islands is in one-to-one correspondence with the plurality of pixel island areas and is spaced apart by the partition walls.

20. A flexible display panel comprising:

a plurality of pixel island areas spaced from each other, and comprising:

a pixel definition layer;

partition walls, disposed on the pixel definition layer and located within the plurality of pixel island areas, and at least one partition wall being disposed in each pixel island area;

a first electrode, disposed on the pixel definition layer;

a substrate;

a driving layer group, disposed between the substrate and the pixel definition layer, the driving layer group comprising an inorganic functional layer and at least two organic functional layers laminated in sequence;

a plurality of electrode wires, each electrode wire of the plurality of electrode wires comprising a first portion and a second portion, the first portion being disposed between two adjacent organic functional layers, and the second portion being disposed between the inorganic functional layer and an adjacent organic functional layer;

a plurality of first contact holes and electrical connection portions, the electrical connection portions being disposed in the first contact holes in one-to-one correspondence, the plurality of patterned islands being electrically connected to corresponding first portions of the electrode wires through the electrical connection portions disposed in the first contact holes; and an encapsulating layer covering the first electrode, the flexible display panel being provided with an annular partition groove, the second portion and the inorganic functional layer are exposed from the annular partition groove, the annular partition groove is disposed in the pixel island area, and an inorganic material of the encapsulating layer fills the annular partition groove and is in contact with the inorganic functional layer, wherein:

the partition walls continuously decrease or intermittently change in width from top to bottom along a thickness direction of the partition walls, the first electrode comprises a plurality of patterned islands, and the plurality of patterned islands is in one-to-one correspondence with the plurality of pixel island areas and is spaced apart by the partition walls.

* * * * *